United States Patent [19]

Risinger

[11] Patent Number: 5,537,070
[45] Date of Patent: Jul. 16, 1996

[54] OUTPUT DRIVER WITH SLEW RATE CONTROL

[75] Inventor: Vance Risinger, Van Alstyne, Tex.

[73] Assignee: Texas Instruments Incorporated, Dallas, Tex.

[21] Appl. No.: 323,330

[22] Filed: Oct. 14, 1994

[51] Int. Cl.$^6$ .................................................. H03K 17/56
[52] U.S. Cl. .......................... 327/170; 327/262; 327/374; 327/538; 327/379
[58] Field of Search .................................. 327/170, 374, 327/381, 109, 379, 387, 538, 513, 262; 326/26, 27

[56] References Cited

U.S. PATENT DOCUMENTS

| | | | |
|---|---|---|---|
| 4,504,779 | 3/1985 | Haman | 327/170 |
| 5,124,570 | 6/1992 | Meno et al. | |
| 5,264,736 | 11/1993 | Jacobson | 327/379 |
| 5,291,071 | 3/1994 | Allen et al. | 327/513 |
| 5,300,828 | 4/1994 | McClure | 327/379 |
| 5,311,077 | 5/1994 | Brown | 327/513 |
| 5,334,882 | 8/1994 | Ting | 327/170 |
| 5,352,945 | 10/1994 | Casper et al. | 327/261 |

Primary Examiner—Timothy P. Callahan
Assistant Examiner—Eunja Shin
Attorney, Agent, or Firm—W. Daniel Swayze, Jr.; W. James Brady, III; Richard L. Donaldson

[57] ABSTRACT

An output driver for use with low voltage level, high speed data transmission busses. An open drain output transistor has a controlled slew rate for a high to low output transition. The slew rate control is provided by controlling the slew rate of the gate voltage of the output transistor in response to an input transition. A slew rate control circuit coupled to the output transistor includes a current source powered by a high stability bias generator, a diode and a capacitance. The current source controls the amount of current available at the gate of the output transistor. The diode and the capacitance combined are used to control the initial voltage at the gate of the output transistor, and the slew rate for the rising voltage waveform at the gate of the output transistor. The resulting circuit has a fast transition time in response to an input transition combined with a tightly controlled slew rate. The output circuit described can meet the proposed specifications for the low voltage level, fast transition busses currently being developed.

16 Claims, 1 Drawing Sheet

OUTPUT DRIVER WITH SLEW RATE CONTROL

FIELD OF THE INVENTION

This invention relates generally to integrated circuits for power applications, circuits and systems which use high speed, low voltage level busses for data communications, and specifically to the design of output drivers and transceiver devices compatible with low voltage level busses such as Gunning transceiver level circuitry.

BACKGROUND OF THE INVENTION

In increasing the data throughput rate for bussed systems, such as processors, memories, personal computer, computer systems, the use of low signal level busses has been proposed. By reducing the high output voltage level standard for a particular bus, the switching time is improved because the voltage swing is limited to a few hundred millivolts, as opposed to the older bus standards which required as many as 5 volts to transition from a low voltage state to a high voltage state. Two of the developing bus standards which adopt this approach are the Gunning transceiver level (GTL) bus, and the CTL or CMOS transceiver level bus. Each of these busses defines the output voltage for the high state as being around 1 volt, with some variation, and the low state being around zero volts. The bus specifications of these proposed busses typically require that they be open-collector or open-drain type busses, that is the bus is pulled up to the high output state by an external R-C network. The output drivers must then overcome these pullup circuits to assert a low voltage on the bus.

The problem in implementing low voltage level signal busses like these proposed busses using the circuits of the prior art is that noise produced by the output driving devices can cause erroneous results in the signal receiving devices, because the available noise margins have been greatly reduced. If the device driving the bus switches quickly from a high state, that is letting the bus rise to a one volt signal, to a low state, that is outputting a signal of approximately zero volts, ringing may occur on the bus. This ringing can cause the receiving devices to erroneously input a transient as true data, that is the ring can look like a zero state on the bus followed by a high state, then a second zero state. The ringing is caused because the transition from the high state to the low state by the output driver is happening too sharply. This is often stated as the slew rate of the output driver device is too low.

Conventional approaches to this problem include adding a slew rate capacitor at the gate of the driving transistor. FIG. 1 depicts a prior art circuit using this approach. Output buffer 1 includes an input for receiving the data to be transmitted on the bus, an output driving transistor, typically an open drain N channel MOSFET transistor, as shown here, although P channel or bipolar devices can be substituted; an output terminal coupled to the drain of the driving transistor 5. A capacitance 3, which can be provided in various ways that are obvious to one skilled in the art, is coupled to the gate input of the output transistor 5.

In operation, assume first that the signal at the input terminal 'IN' in FIG. 1 is low. The output driver transistor 5 is then shut off, and the output terminal is allowed to pull up to the high voltage state. Now a transition occurs at the input terminal 'IN', and a high voltage is present. The voltage at the gate of transistor 5 remains low initially. As capacitor 3 is charged to the high state, the gate voltage will eventually reach a point where the voltage Vgs, that is between the gate and the source of transistor 5, exceeds the turn on or threshold voltage of the output driver and the output driver transistor begins pulling the voltage at the output terminal down towards ground. The capacitor 3 has in fact slowed the rate of transition of the output driver gate 5. With an external load of 25 ohms and 30 pF, a circuit like that in FIG. 1 has been shown to take 0.5 nanoseconds to swing the output from 1.1 volts to 0.6 volts, or 1 Volt/nanosecond. This fast transition rate will produce significant ground spikes within an integrated circuit including the output driver, and will also produce large reflections on the bus, crosstalk between data lines, and noise on the bus. Also, this approach fails to provide the rapid transition time from an input transition to an output transition, that is switching time, required by current state of the art systems, because the capacitance at the gate of the output driver must be charged and discharged before the output driving transistor begins to switch. The result is an output buffer that has a somewhat controller slew rate but is too slow overall to meet the specifications for these newly proposed high speed busses. Also, once the input signal at the 'IN' terminal again transitions, now to a low input state, the capacitor 3 must discharge into the gate of the transistor 5 before the transistor 5 will stop driving the bus low. So the rise time for the output driver 5 is also affected by the capacitor 3, which further slows the circuit without positively impacting the slew rate.

The proposed high speed bus standards require output driving circuitry that has a fast transition time and a tightly controlled slew rate, so that switching noise does not exceed the reduced noise margins. The prior art circuitry cannot provide a solution that meets the requirements of these proposed busses. A need for a circuit having fast switching speed and improved slew control and low noise characteristics thus exists.

SUMMARY OF THE INVENTION

Generally, and in one form of the invention, a circuit and method for an output driver with controlled slew rate for the high to low output transition and an overall fast transition time form a transition at the input to an output transition is provided. The circuit of the invention includes a current source coupled to the gate of an output driving transistor, the current source being biased by a stable bias reference circuit which will provide a controlled current and voltage to the current source across temperature, supply and process variations. The current source provides a predetermined amount of driving current to the gate of the output transistor. The gate of the output transistor is further coupled to a slew rate control circuit that provides a controlled current supply to the driving transistor when the output is to transition from a high to a low state. The slew rate control circuit has a separate discharge circuit so that the low to high transition time of the output transistor is not affected. The slew rate control circuitry allows the output driving transistor to begin the high to low transition quickly, and then controls the slew, so that the overall propagation delay through the circuit remains faster than prior art slew rate controlled output circuits.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 2:
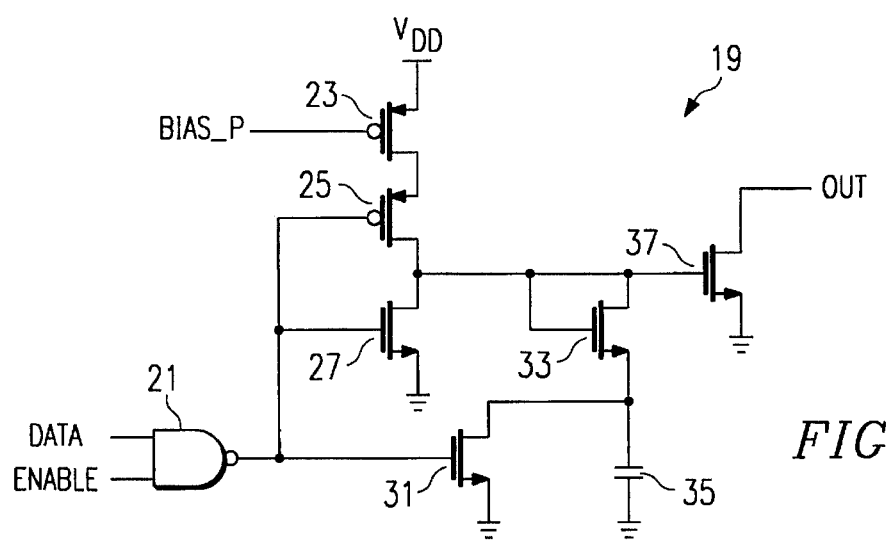
FIG. 2 depicts a first embodiment of an output driver circuit which incorporates the current source and slew rate control circuitry of the invention.

FIG. 2 depicts a first preferred embodiment of an output driving circuit incorporating the circuitry of the invention. Output transistor 37 is a large driving transistor. The output terminal labeled OUT is coupled to a high speed, low voltage level bus having external pull up termination circuitry, which is not shown. The conductive path of the output transistor 37 couples the output terminal to ground. The gate of the output transistor 37 is coupled to the output of an inverter structure made up of transistors 23, 25 and 27. The gate of the output transistor 37 is further coupled to diode connected transistor 33, which has its gate and drain terminals coupled to the gate of transistor 37 and to each other, and the source terminal is then coupled to one terminal of capacitance 35. Capacitance 35 has its second terminal coupled to ground. Transistor 31 has it conductive path coupled across capacitance 35, and its gate terminal coupled to the input of the inverter comprised of transistors 23, 25 and 27. NAND gate 21 provides one input terminal for receiving data, and a second terminal for gating the data input with an enable control line.

In operation, the bus coupled at the OUT terminal will rise to a high voltage level when there is no active driving transistor on the bus. When a driving transistor is to assert a low voltage on the bus, the driving transistor pulls down the bus by coupling the bus to ground. Assume initially that the ENABLE input is in an enabled state, that is a high voltage level. The bus begins in a high voltage level, that is the signal at the data input DATA is a low voltage, and output transistor 37 is inactive. Now assume a transition occurs at the DATA input. NAND gate 21 now puts out a low voltage. Transistor 25 is enabled, which allows the conductive path through transistor 25 and 23 to begin pulling up the gate of transistor 37. The rate at which the gate of transistor 37 will rise is determined by the amount of drive available, which is controlled by the level from the BIAS_P input coupled to the gate of transistor 23. Controlling the bias level at the input BIAS_P will therefore allow control of the gate voltage rise time for the output transistor 37.

Once the gate of transistor 37 starts to rise, the transistor will remain cut off until the threshold voltage of transistor 37 is exceeded. In the prior art circuit of FIG. 1, this will not occur until the capacitance coupled at the gate is fully charged. However, this results in a long propagation delay. Diode connected transistor 33 addresses this problem in the embodiment of FIG. 2. Since diode 33 is coupled in series with the capacitance, the voltage at the gate of the driving transistor is already set at a Vt drop above ground. This means that the output driving transistor 37 will begin turning on much earlier than the prior art circuits would allow, and provides a faster propagation time from an input transition to an output transition. However, the capacitance 35 will take most of the current flowing from the transistors 23 and 25 until it is charged. Thus the amount of drive available to pull the output terminal OUT down is reduced until the capacitance 35 is charged. Capacitance 35 therefore provides slew rate control for the fall time of the output terminal. Once capacitance 35 is charged, the voltage at the gate is allowed to rise to Vdd–2 Vsat drops, one for transistor 23 and one for transistor 25. The output terminal OUT will then fall to a level of one Vsat voltage drop above ground.

When the data input transitions back to a low state, the NAND gate 21 again switches and now puts out a high voltage level. This enables gate 31 to begin discharging capacitance 35. Gate 31 is now important, because without it the driving transistor would have to discharge capacitance 35 like the prior art circuits, which results in additional delay from input transition to output transition. Gate 31 is therefore a speed up circuit over the prior art solutions. The high voltage level at the output of NAND gate 21 also switches the inverter of gates 23, 25 and 27, so that the gate of transistor 37 is now coupled through transistor 27 to a low voltage. The rise time slew rate of the bus coupled to the output terminal OUT is largely determined by the external RC network, therefore no attempt is made within the output driver circuitry 19 to control the rise time slew rate.

The slew rate control of the output driving circuit is obtained in two ways; first by the selection of the capacitance 35, and second by the level at the bias input to transistor 23. The fall time of the output of driving transistor 37 is essentially governed by the rise time of the gate voltage, which is proportional to the charging time of these capacitances; and that is governed by the well known current voltage relationship for capacitors:

$$I = C \frac{dV}{dt}$$

Solving this relationship for the rate of change in voltage yields:

$$\frac{dV}{dt} = \frac{I}{C}$$

Thus the slew rate control of the invention is accomplished by setting the value of the capacitance 35, and by controlling the amount of current available to the gate of transistor 37. The selection of the capacitance 35 must be made by taking into consideration the natural gate capacitance of the driving transistor 37, and any capacitance from transistor 33. The current control is performed by controlling the slew rate for the rising voltage input to the gate of transistor 23. The amount of drive available at the gate of transistor 23 will determine how strongly the transistor 23 is on, and therefore the amount of current available from the Vdd supply. The transistor 23 is therefore a current source for the gate of transistor 37 that is controlled by the voltage level and current available at the BIAS_P input.

As will be understood to those skilled in the art, the circuitry of FIG. 2 can be modified in several ways without changing the basic operation, and this description and the claims contemplate and include these modifications. The output driving transistor 37 is shown as an open drain N channel MOS device. An open collector bipolar device will operate in the same general manner. The capacitance 35 may be provided using any number of circuit design techniques well known to those skilled in the art. In a production embodiment, the capacitance is fabricated using the gates of several P channel devices as the positive terminal, the drain and source terminals being coupled to a ground reference so that the capacitors are in parallel. Fuses are used to provide a one time programmation option, so that the capacitance 35 may be varied according to the needs of the application and the process parameters. In one embodiment that has been produced, the capacitance 35 measures at 4 picofarads. The diode connected transistor 33 can of course be replaced with other diode structures, or like devices. NAND gate 21 is used only as an example, and if no enable control is needed may be omitted, or it may be substituted with a logical equivalent, such as an AND, OR, or NOR gate.

Figure 3:
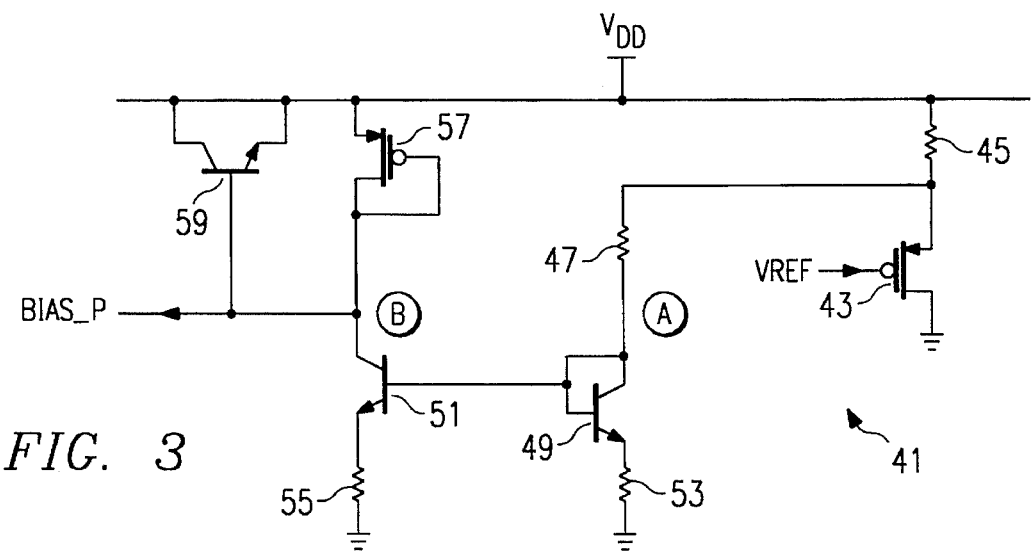
FIG. 3 depicts the circuit detail of the bias generator circuit of the invention.

FIG. 3 depicts a first preferred embodiment for a bias generator to be used with the output driver circuit of FIG. 2. Of course, other embodiments are alternatives, however the embodiment of FIG. 3 has been determined to provide a constant current largely independent of three important variables: supply voltage, process variation, and operating temperature. The independence of the current supplied to the transistor 23 across these variances is critical to proper circuit operation and high yield of fabricated devices, which translates to a lower cost device. Bias circuit 41 if FIG. 3 has a voltage reference input VREF which is reflected through P channel transistor 43 into a resistor voltage divider which comprises resistors 45 and 47. A current mirror is formed using bipolar transistors 49 and 51 and resistors 53 and 55, and current source 57. This output current is then coupled to a capacitance shown as a bipolar device 59.

In operation, the reference voltage input VREF determines the current available in the resistive voltage divider made up of resistors 45 and 47. Several different values are available for these elements to reflect different application needs and to reflect the resistive values obtained from different processes used. The current at node A in FIG. 3 is then mirrored to node B and determines the amount of current available to the output BIAS_P. The resistors 45 and 47 can be trimmed to different values to set the current output BIAS_P for a given process and VREF input value. Changing the BIAS_P output affects the current available to the gate of the output driving transistor 37 in FIG. 2, and therefore the slew rate for the falling output voltage transition. Experimental devices have been produced with slew rates from 1 volt/nanosecond to less than 0.1 volt/nanosecond. The bias circuit of FIG. 3 will present a slew rate of about 0.5 volt/nanosecond, which meets the requirements of the proposed bus specifications at this time. The bias circuit of FIG. 3 will maintain this slew rate across a range of variations in process parameters, temperature and supply voltage.

Figure 1:
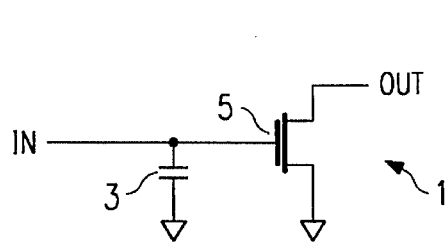
FIG. 1 depicts a prior art output circuit with a slew rate capacitor coupled to the gate of the output transistor.
Figure 4:
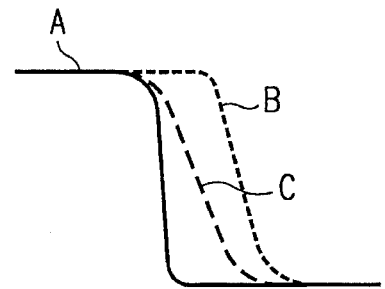
FIG. 4 illustrates the advantages of the invention by comparing the high to low output transition voltage response curves for a driving transistor without slew rate control, the prior art circuit of FIG. 1, and the embodiments of FIG. 2 and 3 incorporating the invention.

FIG. 4 illustrates the advantages of the invention over the prior art circuit of FIG. 1 and over a driving transistor with no slew rate control. Three typical high to low voltage transition curves are shown. The curve labeled A is for an open drain MOS output transistor without slew rate control. It looks very sharp, like a square wave. A second curve, labeled B, illustrates a typical response from a circuit such as the one shown in FIG. 1. Although the circuit has a longer fall time and does reduce the likelihood of transients and noise, the delay time from the input transition to the output transition is quite long. The curve labeled C shows the response curve typically obtained from the circuitry of FIGS. 2 and 3 incorporating the invention. Because the circuitry incorporating the invention insures that the output driving transistor begins driving quickly in response to an input transition, the time from an input transition to the output transition is shorter than that obtained using the prior art of FIG. 1. Also, because of the slew rate control circuitry, the voltage response illustrates a longer response time which reduces noise and switching transients over the circuitry without slew rate control.

An eighteen bit transceiver has been produced as an integrated circuit using eighteen of the output drivers of the preferred embodiment to drive the output pins. These integrated circuits have been shown to have an output transition time which has a 1 nanosecond minimum, a two nanosecond typical, and a three nanosecond worst case, which meet the requirements for the proposed high speed low voltage level busses. The slew rate control circuitry produces a high to low transition that will be far less likely to produce noise and transients on the bus than the circuits of the prior art.

A few preferred embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An output buffer circuit, comprising:

an output driver transistor coupling a circuit output terminal to a ground terminal responsive to a gate input;

slew rate control circuitry coupled to the gate input of said output driver transistor for driving the gate of said output driver transistor to a predetermined voltage at a predetermined rate, responsive to a transition at a circuit input, comprising diode means having one terminal coupled to said gate input of said output driving transistor, for providing a voltage at said gate input above a ground voltage;

capacitance means coupled between another terminal of said diode means and ground voltage, said capacitance means being charged in response to a first transition at said input terminal such that said diode means is between said gate input and said capacitance means; and, discharge circuitry coupled across said capacitance means, said discharge circuitry for discharging said capacitance means in response to a second transition at said circuit input terminal; and a current source circuit for providing current to said gate input of said output driver transistor and to said slew rate control circuit, said current source circuit being supplied by a bias voltage that is constant over a range of temperature and supply voltage variations.

2. The output driver circuitry of claim 1, wherein said output driving transistor is a MOS transistor with its drain terminal coupled to the circuit output terminal and its source terminal coupled to said ground voltage.

3. The output driver circuitry of claim 1, wherein said current source circuitry comprises:

a first transistor which selectively couples the gate input terminal of said output driving transistor to a current supply node, responsive to a transition at said circuit input terminal; and a second transistor which couples said current supply node to a power supply and has a predetermined bias voltage at its gate terminal.

4. The current source circuitry of claim 3, wherein said first and second transistors are PMOS transistors.

5. The current source circuitry of claim 3, wherein said first and second transistors are further coupled to a third transistor which couples said gate of said output driving transistor to a reference voltage responsive to a transition at said input terminal, said first, second and third transistors of said current source forming an inverter.

6. An output driving circuit, comprising:

an MOS output transistor, said MOS output transistor having its drain coupled to an output terminal, having a source terminal coupled to a ground reference voltage, and having a gate input terminal;

capacitance means coupled to said gate input terminal and further coupled to said ground reference voltage;

a diode coupled between said gate input terminal and said capacitance means;

a current source coupled to said gate input terminal and to a circuit input terminal, for supplying a constant, predetermined current to said gate terminal and to said diode and said capacitance in response to a transition at said circuit input terminal; and said current source, said capacitance, and said diode operable for placing a rising voltage waveform with a predetermined slew rate at said gate input terminal in response to a transition at said circuit input terminal.

7. The output driving circuit of claim 6, wherein said current source comprises a first PMOS transistor having a gate coupled to said circuit input terminal and being serially coupled between said gate input terminal of said output driving transistor and a second PMOS transistor which has its gate coupled to a bias voltage, said second PMOS transistor being further coupled to a supply voltage and said second PMOS transistor supplying a predetermined current to said gate input terminal of said output driving transistor, the predetermined current being proportional to said bias voltage.

8. The output driving circuit of claim 6, wherein said diode comprises a diode connected MOS transistor.

9. The output driving circuit of claim 6, wherein said output driving circuit further comprises a bias generator coupled to said current source, said bias generator supplying a voltage to said current source which remains constant independent of variations in operating temperature and supply voltage.

10. The output driving circuit of claim 6, wherein said capacitance means comprises at least one MOS transistor having the gate terminal as one terminal of the capacitance means, and the source and drain terminals coupled together forming a second terminal of the capacitance means, the gate oxide of said MOS transistor acting as the dielectric for the capacitance means.

11. An output driving circuit, comprising:

an NMOS output transistor with a drain terminal coupled to a circuit output terminal, a source terminal coupled to a ground reference voltage, and a gate terminal;

a diode having one terminal coupled to said gate terminal;

a capacitor coupled between another terminal of said diode and said ground reference voltage such that said diode is between said capacitor and said gate terminal;

a discharge transistor coupled across said capacitor;

a current source coupled to a bias voltage and to a circuit input terminal, for providing a constant current to said gate terminal responsive to a transition at said circuit input terminal;

a bias generator coupled to said current source for driving said bias voltage, the bias generator outputting a constant bias voltage over a wide range of temperature and supply voltage conditions;

wherein the transition time at the circuit output terminal from a high voltage state to a low voltage state is a predetermined time, the predetermined time being controlled by the value of said capacitor and the bias voltage output by said bias generator.

12. A method for providing an output driver circuit, comprising the steps of:

providing an output transistor operable to couple an output terminal to a ground terminal responsive to a gate input;

providing a capacitance means coupled to said gate input;

providing a current source coupled to said gate input and operable to charge said capacitance means responsive to a transition at an input terminal;

providing a diode means coupled between said gate input and said capacitance means, operable for providing a voltage step at said gate input when said capacitance means begins charging in response to said transition at said input terminal;

providing a bias generator coupled to said current source for supplying a bias voltage to said current source, the current output of said current source being proportional to said bias voltage; and operating said bias generator, said current source and said capacitance means to provide a rising voltage signal at said gate input responsive to a transition at the input terminal, said rising voltage signal starting at a predetermined voltage and rising at a predetermined rate, the skew rate of the output voltage of said output driving transistor being controlled by the rising voltage signal at the gate terminal.

13. The method of claim 12, wherein said step of providing a capacitance means comprises the step of:

providing a capacitor having a first terminal coupled to said gate input and a second terminal coupled to a ground reference voltage.

14. The method of claim 13, and further comprising the step of:

providing discharge circuitry coupled across said capacitor, operable to discharge said capacitor to ground in response to a transition at said input terminal.

15. The method of claim 12, wherein said step of providing a current source comprises the steps of:

providing a first transistor which selectively couples the gate input of said output driving transistor to a current supply node, responsive to a transition at said circuit input terminal;

providing a second transistor which couples said current supply node to a power supply and has a predetermined bias voltage at its gate terminal; and operating said first and second transistors so that in response to a transition at said circuit input terminal, said current supply node receives a predetermined current through said second transistor proportional to the bias voltage, said gate input of said output driving transistor then receiving the predetermined current through said first transistor.

16. The method of claim 12, wherein said step of providing a bias generator comprises the step of providing circuitry to generate a bias voltage of a predetermined level, said circuitry being operable to maintain said bias voltage at said predetermined level independent of variations in the ambient temperature and in variations of the supply voltages.

* * * * *